(12) United States Patent
Kanamura et al.

(10) Patent No.: US 8,603,903 B2
(45) Date of Patent: Dec. 10, 2013

(54) SEMICONDUCTOR DEVICE MANUFACTURING METHOD

(75) Inventors: Masahito Kanamura, Kawasaki (JP); Toshihide Kikkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 88 days.

(21) Appl. No.: 13/443,228

(22) Filed: Apr. 10, 2012

(65) Prior Publication Data

US 2012/0196419 A1    Aug. 2, 2012

Related U.S. Application Data

(62) Division of application No. 12/805,506, filed on Aug. 3, 2010, now Pat. No. 8,173,529, which is a division of application No. 12/068,796, filed on Feb. 12, 2008, now Pat. No. 7,800,133.

(30) Foreign Application Priority Data

Feb. 15, 2007   (JP) ................................ 2007-035346

(51) Int. Cl.
H01L 21/28       (2006.01)
(52) U.S. Cl.
USPC .......................................... 438/572; 438/576
(58) Field of Classification Search
USPC .................. 438/571–582, E21.24, E21.374
See application file for complete search history.

(56) References Cited

U.S. PATENT DOCUMENTS

| | | | |
|---|---|---|---|
| 7,521,325 B2 | 4/2009 | Sakoda et al. | 438/287 |
| 7,859,014 B2 | 12/2010 | Nakayama et al. | 257/192 |
| 8,003,504 B2 | 8/2011 | Immorlica et al. | 438/582 |
| 8,389,351 B2 * | 3/2013 | Ohki et al. | 438/197 |
| 2006/0011915 A1 | 1/2006 | Saito et al. | 257/65 |
| 2006/0081939 A1 | 4/2006 | Akasaka et al. | |
| 2006/0197107 A1 | 9/2006 | Kanamura et al. | 257/194 |
| 2006/0214243 A1 | 9/2006 | Sakoda et al. | 257/410 |
| 2007/0158692 A1 | 7/2007 | Nakayama et al. | 257/213 |
| 2007/0164322 A1 | 7/2007 | Smith et al. | 257/256 |
| 2008/0105901 A1 | 5/2008 | Tabatabaie et al. | 257/194 |
| 2008/0179631 A1 | 7/2008 | Kinzer | 257/194 |

FOREIGN PATENT DOCUMENTS

| | | |
|---|---|---|
| JP | 2002-324813 | 11/2002 |
| JP | 2005-183597 | 7/2005 |
| JP | 2006-100721 | 4/2006 |
| JP | 2006-108602 | 4/2006 |
| JP | 2006-278488 | 10/2006 |
| WO | 2006/001369 | 1/2006 |

OTHER PUBLICATIONS

Japanese Office Action issued in counterpart application No. 2007-035346 mailed Jun. 19, 2012 with English Summary (4 pages).

* cited by examiner

*Primary Examiner* — Cuong Q Nguyen
(74) *Attorney, Agent, or Firm* — Kratz, Quintos & Hanson, LLP

(57) ABSTRACT

In an MIS-type GaN-FET, a base layer made of a conductive nitride including no oxygen, here, TaN, is provided on a surface layer as a nitride semiconductor layer to cover at least an area of a lower face of a gate insulation film made of $Ta_2O_5$ under a gate electrode.

6 Claims, 6 Drawing Sheets

SEMICONDUCTOR DEVICE MANUFACTURING METHOD

CROSS-REFERENCE TO RELATED APPLICATIONS

This application is a Divisional application of Ser. No. 12/805,506 filed on Aug. 3, 2010 now U.S. Pat. No. 8,173,529, which is a Divisional of application Ser. No. 12/068,796 filed Feb. 12, 2008 (U.S. Pat. No. 7,800,133), which is based upon and claims the benefit of priority from the prior Japanese Patent Application No. 2007-035346, filed on Feb. 15, 2007, the entire contents of which are incorporated herein by reference.

This application is based upon and claims the benefit of priority from the prior Japanese Patent Application No. 2007-035346, filed on Feb. 15, 2007, the entire contents of which are incorporated herein by reference.

BACKGROUND OF THE INVENTION

1. Field of the Invention

The present invention relates to a semiconductor device formed in a nitride semiconductor layer made of a group III-V nitride semiconductor and a manufacturing method of the same.

2. Description of the Related Art

Recently, in compound semiconductors, an HEMT (hereinafter, referred to as GaN-FET) using a heterojunction between an AlGaN layer and a GaN layer and having a group III-V nitride semiconductor layer including a GaN layer made as an electron transit layer has been widely developed. GaN is a material having a wide band gap, a high breakdown field strength, and a high saturation electron velocity, so it is considered to be promising as a material for high-voltage operations and high-power devices.

In such a compound semiconductor device for high-voltage operations, it is required to reduce gate-leakage current. As a gate electrode of a GaN-FET, a schottky electrode made of Ni, Pt and the like is now used. In this case, however, there is a problem that gate-leakage current is generated when the gate voltage is increased in a forward direction. As a method for solving this problem, there is a MIS-type GaN-FET having a gate insulation film of insulation film made of $SiO_2$, $Al_2O_3$ and the like.

With reference to FIG. 6, a conventional MIS-type GaN-FET (a first conventional example) will be described.

By a known MOVPE method, an electron transit layer 102 having a film thickness of about 3 μm and an electron supply layer 103 made of an intentionally undoped AlGaN (for example, $Al_{0.25}Ga_{0.75}N$) of intentionally undoped GaN, having a film thickness of 20 nm, are sequentially deposited on a sapphire substrate 101.

Next, after a source electrode 104 and a drain electrode 105 are formed by using, for example, Ti/Al, a gate insulation film 106 made of $SiO_2$, $Si_3N_4$ and the like is formed. Then, a gate electrode 110 is formed on the gate insulation film 106 by, for example, a lift-off method. With this process, a MIS-type GaN-FET according to the first conventional example is completed.

According to the first conventional example, since $SiO_2$ and $Si_3N_4$, which are used as a material of the gate insulation film 106, do not have a high dielectric constant, problems such as shifting of a threshold value to a reverse direction or reduction in mutual conductance can occur. To solve these problems, it is effective to apply oxide having relatively high dielectric constant, such as Ta, Hf, Zr, to a gate insulation film.

With reference to FIG. 7, a MIS-type GaN-FET (second conventional example) having a gate insulation film made of a high dielectric constant material will be described.

An electron transit layer 102, which is made of an intentionally undoped GaN and having a film thickness of about 3 μm, and an electron supply layer 103, which is made of an intentionally undoped AlGaN (for example, $Al_{0.25}Ga_{0.75}N$) and having a film thickness of 20 nm, are sequentially deposited on a sapphire substrate 101 by using a known MOVPE method.

After a source electrode 104 and a drain electrode 105 are formed as layers, a gate insulation film 111 made of $Ta_2O_5$ and the like is formed as an insulating material having a high dielectric constant. Then, a gate electrode 110 is formed on the gate insulation film 111 by, for example, a lift-off method. With this process, a MIS-type GaN-FET according to the second conventional example is completed.

[Patent Document 1] Japanese Patent Application Laid-Open No. 2002-324813

[Patent Document 2] Japanese Patent Application Laid-Open No. 2006-108602

As described above, according to the MIS-type GaN-FET disclosed in the second conventional example, since the gate insulation film is made of an oxide of a high dielectric constant material such as Ta, Hf and Zr, shifting of a threshold value and reduction in mutual conductance can be prevented. On the other hand, however, using a gate insulation film made of an oxide causes following problems. When an insulation film, here, a gate insulation film, is deposited on a nitride semiconductor layer, an interface state is generated between interfaces of the nitride semiconductor layer and the gate insulation film. The interface state causes an electron trap so that the amplification characteristic of the semiconductor is deteriorated.

Further, in addition to the above problem, there is a problem that is specific to a group III-V nitride semiconductor device such as a GaN-FET. That is, nitrogen is often separated from a nitride semiconductor layer during a manufacturing process. Particularly, when such a nitrogen separation occurs in an area under a gate electrode, a leak current can be increased. To solve this problem, nitrogen can be compensated to the nitride semiconductor layer where nitrogen separation occurs during the manufacturing process; however, this solution requires additional or more complicated processes.

SUMMARY OF THE INVENTION

According to an aspect of an embodiment, there is a semiconductor device having a nitride semiconductor layer made of a group III-V nitride semiconductor material, a gate insulation film formed above the nitride semiconductor layer and made of a high dielectric constant material, a gate electrode formed on the gate insulation film, and a base layer made of a conductive nitride material to cover at least a lower face of the gate insulation film under the gate electrode.

According to an aspect of an embodiment, there is a manufacturing method having steps of forming a protective insulation film above a nitride semiconductor layer made of a group III-V nitride semiconductor material, forming a through groove opening the protective insulation film in an area of the protective insulation film where a gate electrode is formed, forming a base layer made of a conductive nitride to cover at least a bottom face of the through groove, forming a gate insulation film made of a high dielectric constant material above the protective insulation film to fill the through groove via the base layer, and forming the gate electrode in a portion including an area on the gate insulation film where is aligned with and above the base layer.

According to an aspect of an embodiment, there is a manufacturing method having steps of forming a base layer made of a conductive nitride to an area including at least a portion where an gate electrode is formed, above a nitride semiconductor layer made of a group III-V nitride semiconductor material, forming a gate insulation film made of a high dielectric constant material to cover the base layer, and forming the gate electrode to a portion on the gate insulation film where is aligned with the base layer.

DETAILED DESCRIPTION OF THE PREFERRED EMBODIMENTS

Figure 1A:
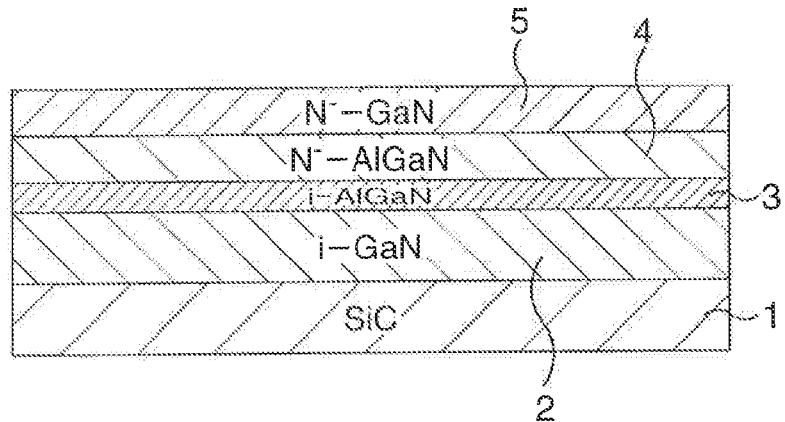
FIGS. 1A to 1C are schematic sectional views showing a manufacturing method of a MIS-type GaN-FET in order of processes according to a first embodiment.

Inventors of the present invention carefully studied the following items (1) and (2) to solve the above problems with least additional or complicated manufacturing process and achieved the present invention described below.

(1) In a group III-V nitride semiconductor device having a gate insulation film made of a high dielectric constant oxide (particularly, with a relative permittivity of 10 or more), an interface state generated between interfaces of a nitride semiconductor layer and the gate insulation film is caused by a Ga oxide, which is uneven in thickness and size and formed on the nitride semiconductor layer. Such a Ga oxide is formed because oxygen in the high dielectric constant oxide deposited as a material of the gate insulation film and group-III element such as Ga in the nitride semiconductor react each other. By considering based on this presumption, it is preferable to block between the nitride semiconductor layer and the gate insulation film with a structure including no oxygen to prevent the occurrence of the interface state. Here, as a material used for the structure, a conductive material having least impact to an insulation performance of the gate insulation film is preferable in view of maintaining sufficient insulation performance of the gate insulation film. Here, an insulating material can be used as a material for the structure in a particular cases such that an extremely thin an even film is available or the like.

(2) It is preferable to provide a structure including nitrogen is disposed in an area under the gate electrode to compensate removed nitrogen particularly in an area of the nitride semiconductor layer under the gate electrode during the manufacturing process.

According to the present invention, a base layer made of a conductive nitride including no oxygen is formed on the nitride semiconductor layer to cover at least an area of a lower face of the gate insulation film under the gate electrode, in order to realize the above items (1) and (2). As a base layer, a conductive material, which includes no oxygen, can prevent an oxidation of group-III element (such as Ga) in the nitride semiconductor layer without having impact to the insulation performance of the gate insulation film. Further, when the base layer is made of a nitride, it can compensate the nitrogen separated from the nitride semiconductor layer.

Here, an occurrence of the interface state and a nitrogen separation of the nitride semiconductor layer have an impact on channels, which are placed particularly under the gate electrode. Thus, the base layer is required to cover the area of the lower face of the gate insulation film under the gate electrode. Further, to prevent the impact as much as possible, the base layer can be formed in a wider area of the lower face of the gate insulation film including the above area with a limitation of not to contact (electrically contact) with a source electrode and a drain electrode.

Here, as the conductive nitride used for the base layer, it is preferable to use a metal nitride constituting the high dielectric constant material of the gate insulation film. When the base layer is made of a metal nitride, which is the same metal composing the gate insulation film, the base layer can be inserted and formed without concerning an influence on the nitride semiconductor layer. Here, the metal nitride is preferably made of a conductive material; however, insulation material can be used in particular cases as described above.

Concretely, as the high dielectric constant material of the gate insulation film, it is preferable to use an oxide including at lease one selected from tantalum, hafnium, zirconium, lanthanum, and titanium. Further, as the conductive nitride of the base layer, it is preferable to use a nitride including at least one selected from tantalum, hafnium, zirconium, lanthanum and titanium. Here, when the base layer is made of a metal nitride, which is same metal included in the gate insulation film, a combination of the above metal oxide and a corresponding metal nitride (for example, tantalum oxide and tantalum nitride) can be used as the high dielectric constant material of the gate insulation film and the conductive nitride of the base layer.

Patent Document 1 discloses a technique for forming a metal layer and an insulation film between a compound semiconductor layer and a gate electrode to adjust a gate capacitance and obtain modulation effect in a two-dimensional electron gas density. However, in this case, since the object of the metal layer is to adjust the gate capacitance, a layered stack of elemental metallic materials such as Ti/Pt is formed, and not a group III-V nitride semiconductor having a compound semiconductor layer including nitrogen. Thus, the invention of Patent Document 1 is different from the present invention that provides a base layer made of a conductive nitride between a compound semiconductor layer and a gate insulation film to solve the occurrence of interface state between interfaces of the gate insulation film and compound semiconductor layer and the nitrogen separation specific to a case of using a group III-V nitride semiconductor as a compound semiconductor layer without additional or complicated manufacturing processes.

Patent Document 2 discloses a CMOS-type MISFET using a gate insulation film made of a high dielectric constant material. In this CMOS-type MISFET, a gate electrode is formed on a Si substrate via a gate insulation film and nitrogen is applied particularly to the gate insulation film and gate electrode of p-channel MISFET to improve both of an electron mobility and a hole mobility. Here, when the gate electrode is made of Ta, for example, the TaN is used in a portion of the gate electrode, where to contact with a surface of the gate insulation film. However, the object and structure of the invention of the Patent Document 2 are basically different from those of the present invention since what is formed on the Si substrate is an MISFET, and not a compound semiconductor device.

Concrete embodiments of the present invention will be described in detail with reference to the drawings. The present invention focuses on a MISFET having a group III-V nitride semiconductor layer. As a group III-V nitride semiconductor, compound semiconductor is described in form of $(In_xAl_yGa_z)N$ $x\geq 0$, $y\geq 0$, $z\geq 0$, and $x+y+z=1$, and, in following embodiments, a device configuration and a manufacturing method will be described with an example of an MIS-type GaN-FET having a nitride semiconductor layer composed in form of $Al_xGa_{1-x}N$ $0<X\leq 1$.

-First Embodiment-

FIGS. 1A to 2C are schematic sectional views showing a manufacturing method of a MIS-type GaN-FET in an order of process, according to a first embodiment.

As shown in FIG. 1A, an electron transit layer 2 made of a intentionally undoped GaN with a film thickness of about 3 μm, an intermediate layer 3 made of an intentionally undoped AlGaN (for example, $Al_{0.25}Ga_{0.75}N$) with a film thickness of about 3 nm, an electron supply layer 4 made of AlGaN (for example, $Al_{0.25}Ga_{0.75}N$) of lightly doped N-type (N-: for example, about Si doping concentration $2\times 10^{18}/cm^3$) with a film thickness of about 20 nm and a surface layer 5 made of GaN (for example, $Al_{0.25}Ga_{0.75}N$) of lightly doped N-type (N-: for example, about Si doping concentration $2\times 10^{18}/cm^3$) with a film thickness of less than 10 nm (for example, about 5 nm) are sequentially deposited on a SiC substrate 1 in order, by using a known MOVPE method.

Figure 1B:
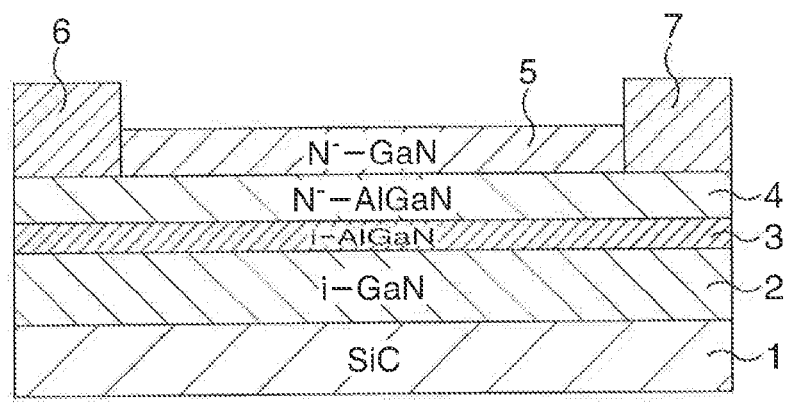

As shown in FIG. 1B, a source electrode 6 and a drain electrode 7 are formed.

In detail, a resist is applied on the surface layer 5 and openings are formed in areas of the resist where the source electrode 6 and drain electrode 7 are to be formed by lithography to form a resist mask (not shown).

Then, through the openings of the resist mask on the surface layer 5, uncovered portions are dry etched with, for example, chlorine gas or inert gas such as Cl2 gas as an etching gas. In the dry etching process, the portions of the surface layer 5 is made thinner, an openings are made therein so that the electron supply layer 4 is exposed in the openings, or the areas corresponding to the exposed portions of the electron supply layer 4 are made thinner through the openings. According to the example shown in the figures, openings are made in the surface layer 5 by dry etching until the electron supply layer 4 is exposed in the openings.

Then, a metallic material (Ti/Al is used in this example) is deposited on the resist mask, with a enough film thickness to fill the openings of the resist mask and the openings of the surface layer 5, by using a vapor deposition method, for example. The source electrode 6 and drain electrode 7, which are ohmic electrodes, are formed by an annealing treatment at a temperature of, for example, 550 degrees after removing the resist mask and the Ti/Al thereon by a lift-off method.

Figure 1C:
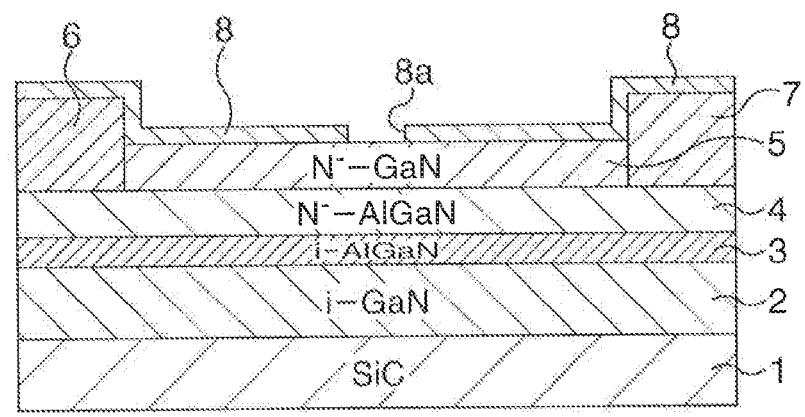

As shown in FIG. 1C, a protective insulation film 8 is formed and a through groove 8a opening the protective insulation film 8 is formed in the protective insulation film 8.

In detail, an insulating material such as $Si_3N_4$ is deposited on all over the SiC substrate 1 by a CVD method and the like, with a film thickness of about 100 nm, to form the protective insulation film 8. Since $Si_3N_4$ is compatible with GaN and the like and does not have any negative effect on GaN, the protective insulation film 8 can substantially perform function for protecting the surface layer 5.

Then, a resist is applied on the protective insulation film 8 and an opening portion 10a (having a width of about 0.8 μm, for example) is formed, by lithography, in an area of the resist where the gate electrode is to be formed. With this procedure, a resist mask 10 is formed.

Then, by using the resist mask 10, a portion of the protective insulation film 8 where is uncovered by the resist mask 10 is dry etched with an etching gas such as a fluorinated gas through the opening portion 10a until the surface of the surface layer 5 is exposed. With this procedure, the through groove 8a along the opening portion of the resist mask 10 is formed in the area of the protective insulation film 8 where the gate electrode is to be formed.

Figure 2A:
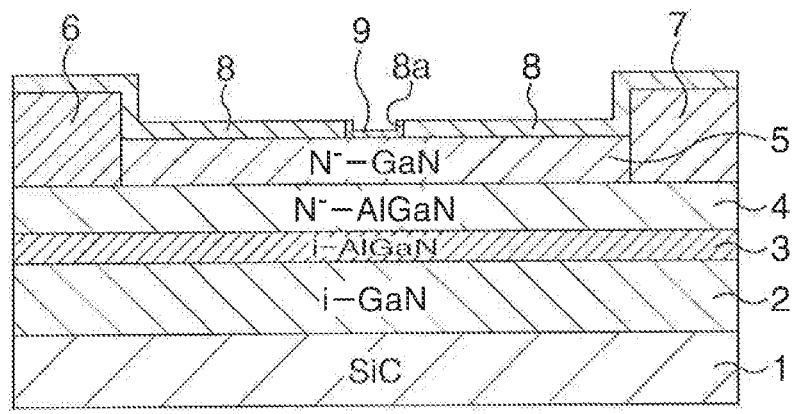
FIGS. 2A to 2C are schematic sectional views showing the manufacturing method of the MIS-type GaN-FET in order of processes according to the first embodiment, further to FIGS. 1A to 1C.

As shown in FIG. 2A, a base layer 9 made of conductive nitride is formed to cover an inner wall of the through groove 8a.

In detail, by using the resist mask 10, conductive nitride, here, tantalum nitride (for example, TaN), having a film thickness of about 2 nm is deposited on all over the resist mask 10 including the inner wall of the through groove 8a by a sputtering method, a vapor deposition method or the like. Then, the resist mask 10 and the TaN thereon is removed by the lift-off method so that the base layer 9 is formed to cover the inner wall of the through groove 8a with TaN.

Figure 2B:
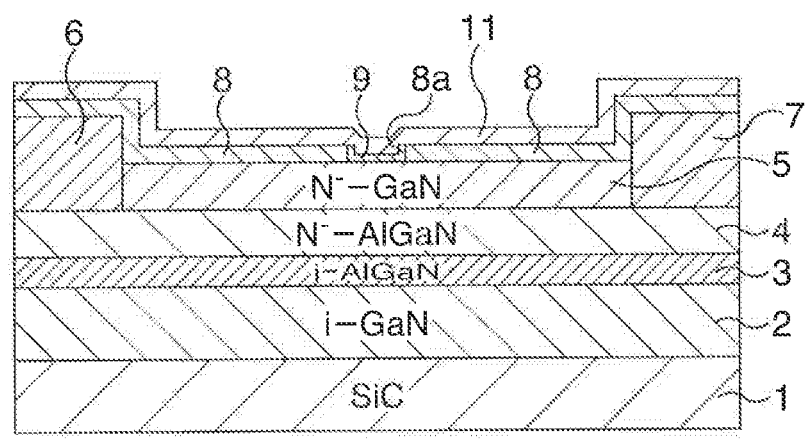

As shown in FIG. 2B, a gate insulation film 11 is formed on the protective insulation film 8.

In detail, a high dielectric constant material, here, a high dielectric constant oxide such as $Ta_2O_5$ having a film thickness 20 nm is deposited on the protective insulation film 8 including inside the through groove 8a by the sputtering method and the like. With this procedure, the gate insulation film 11 filling the inside of the through groove 8a via the base layer 9 and covering the protective insulation film 8 is formed.

As the high dielectric constant oxide of the gate insulation film 11, one selected from tantalum oxide (for example, $Ta_2O_5$), hafnium oxide ($HfO_2$), zirconium oxide (for example, $ZrO_2$), lanthanum oxide (for example, $La_2O_3$) and titanium oxide (for example, $TiO_2$) is used.

Further, as the conductive nitride of the base layer 9, one selected from tantalum nitride (for example, TaN), hafnium nitride (for example, HfN), zirconium nitride (for example, ZrN), lanthanum nitride (for example, LaN) and titanium nitride (for example, TaN) is used.

Preferably, as the conductive nitride of the base layer 9, the metal nitride constituting the high dielectric constant material of the gate insulation film 11 (in this example, the high dielectric constant oxide) is used. In this case, as preferable combinations of the high dielectric constant oxide of the gate insulation film 11 and the conductive nitride of the base layer 9 in the above example are: tantalum oxide and tantalum nitride (as shown in the present embodiment), hafnium oxide and hafnium nitride, zirconium oxide and zirconium nitride, lanthanum oxide and lanthanum nitride, and titanium oxide and titanium nitride.

Figure 2C:
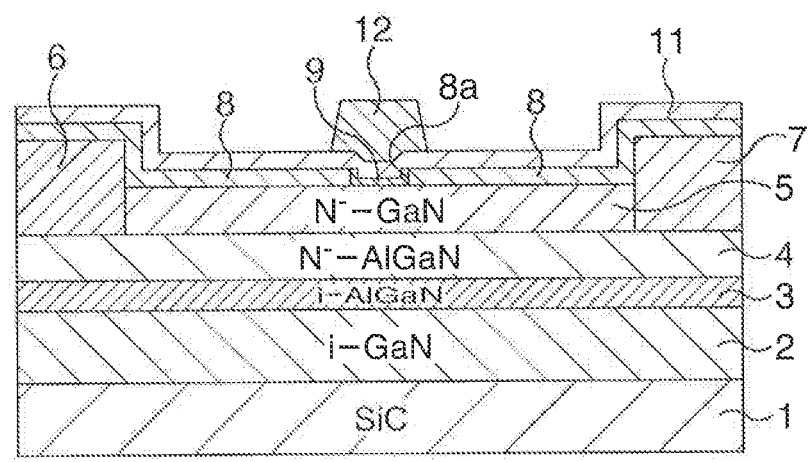

As shown in FIG. 2C, a gate electrode 12 is formed.

In detail, a resist is applied on the gate insulation film 11 and an opening portion (for example, with a width of about 1.2 μm) is formed, by the lithography, in an area of the resist where the gate electrode 12 is to be formed, that is, an area of the gate insulation film 11, where the base layer 9 is formed on the through groove 8a (in a concave shape corresponding to the shape of the through groove 8a). With this process, a resist mask (not shown) is formed.

Then, by the vapor deposition method and the like, a metallic material with a enough film thickness filling the opening portion of the resist mask is deposited on the resist mask. As the metallic material, Ni (with a film thickness of about 30 nm)/Au (with a film thickness of about 300 nm) is used here. Then, the resist mask and the Ni/Au thereon are removed by the lift-off method. With this process, the gate electrode 12 is formed in a manner that the gate insulation film 11 is placed under the gate electrode 12 and on the surface layer 5 via the base layer 9.

Thereafter, through processes for forming an interlayer insulation film, a contact hole, wirings and the like, the MIS-type GaN-FET according to the present embodiment is completed.

As described above, according to the present embodiment, the gate insulation film 11 is made of a high dielectric constant oxide to prevent shifting of a threshold value and reduction in mutual conductance. This prevents an occurrence of an interface state between interfaces of the surface layer 5 and the gate insulation film 11, provides a desired insulating function of the gate insulation film 11, and supplies nitrogen separated during the manufacturing process without any additional or complicated process. Accordingly, a reliable MIS-type GaN-FET is provided.

-Second Embodiment-

FIGS. 3A to 4C are schematic sectional views showing a manufacturing method of a MIS-type GaN-FET in order of process, according to a second embodiment.

Figure 3A:
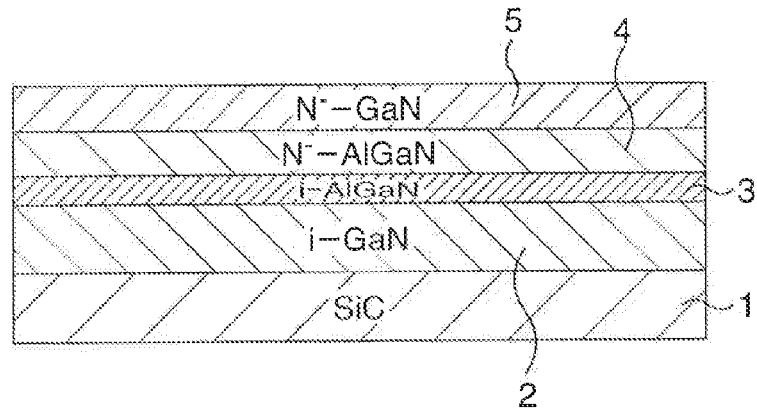
FIGS. 3A to 3C are schematic sectional views showing a manufacturing method of a MIS-type GaN-FET in order of processes according to a second embodiment.

As shown in FIG. 3A, similar to the case of FIG. 1A, an electron transit layer 2 made of an intentionally undoped GaN, an intermediate layer 3 made of an intentionally undoped AlGaN (for example, $Al_{0.25}Ga_{0.75}N$), an electron supply layer 4 made of AlGaN (for example, $Al_{0.25}Ga_{0.75}N$) of a lightly doped N-type (N-: for example, about Si doping concentration $2\times10^{18}/cm^3$) and a surface layer 5 made of GaN (for example, $Al_{0.25}Ga_{0.75}N$) of a lightly doped N-type (N-: for example, about Si doping concentration $2\times10^{18}/cm^3$) are sequentially deposited on a SiC substrate 1 in order.

Figure 3B:
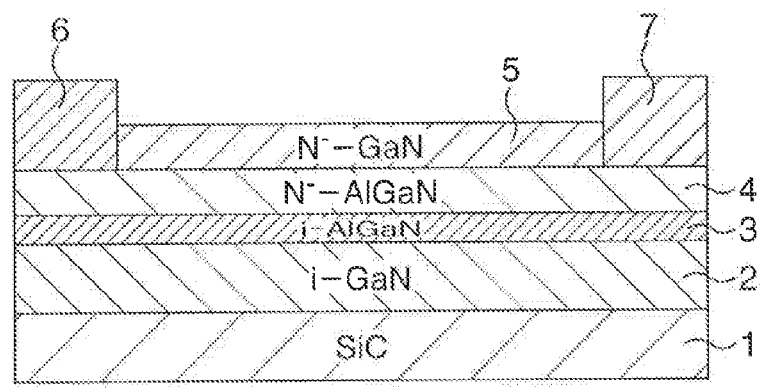

As shown in FIG. 3B, similar to FIG. 1B, a source electrode 6 and a drain electrode 7 are formed.

Figure 3C:
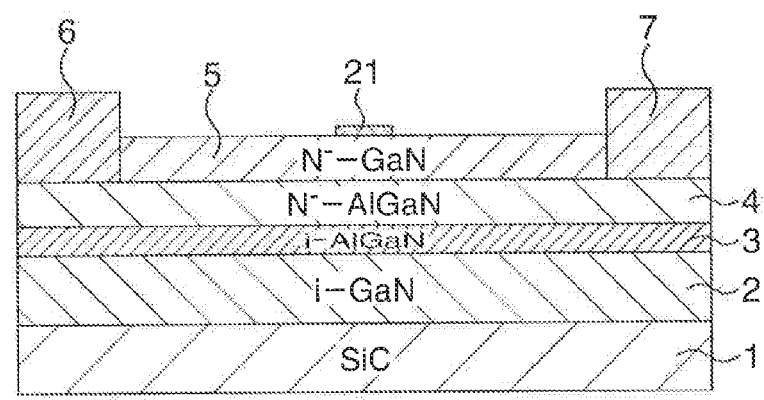

Then, as shown in FIG. 3C, a base layer 21 is formed in an area where a gate electrode is to be formed.

In detail, a resist is applied all over the surface layer 5 and opening portions (having a width of 0.8 μm, for example) is formed in an area of the resist, where the gate electrode is to be formed by lithography. With this process, a resist mask (not shown) is formed.

Then, a conductive nitride, here, a tantalum nitride (for example, TaN), having a film thickness of 2 nm is deposited on an entire area of the resist mask including inside the opening portions by a vapor deposition method, for example. Then, the resist mask and the TaN thereon are removed by a lift-off method. With this process, the base layer 21 made of TaN is formed in an area of the surface layer 5, where the gate electrode is to be formed.

Figure 4A:
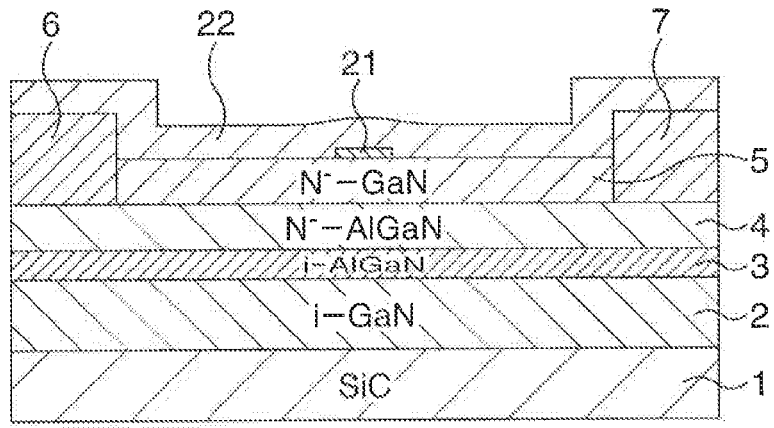
FIGS. 4A to 4C are schematic sectional views showing the manufacturing method of the MIS-type GaN-FET in order of processes according to the second embodiment, further to FIGS. 3A to 3C.

As shown in FIG. 4A, a gate insulation film 22 is formed in manner of covering the base layer 21.

In detail, a high dielectric constant material, here, a high dielectric constant oxide such as $Ta_2O_5$ having a film thickness of about 20 nm is deposited on the surface layer 5 by a sputtering method. Accordingly, the gate insulation film 22 covering the base layer 21 is formed.

The high dielectric constant oxide of the gate insulation film 22 is made of one selected from tantalum oxide (for example, $Ta_2O_5$), hafnium oxide ($HfO_2$), zirconium oxide (for example, $ZrO_2$), lanthanum oxide (for example, $La_2O_3$), titanium oxide (for example, $TiO_2$) and the like.

Further, the conductive nitride of the base layer 21 is made of one selected from tantalum nitride (for example, TaN), hafnium nitride (for example, HfN), zirconium nitride (for example, ZrN), lanthanum nitride (for example, LaN), titanium nitride (for example, TaN) and the like.

Preferably, the conductive nitride of the base layer 21 is made of the metal nitride constituting the high dielectric constant material of the gate insulation film 22 (that is, high dielectric constant oxide in this example). In this case, according to the above example, preferable combinations of the high dielectric constant oxide of the gate insulation film 22 and the conductive nitride of the base layer 21 are: tantalum oxide and tantalum nitride (a shown in the present embodiment), hafnium oxide and hafnium nitride, zirconium oxide and zirconium nitride, lanthanum oxide and lanthanum nitride, and titanium oxide and titanium nitride.

Figure 4B:
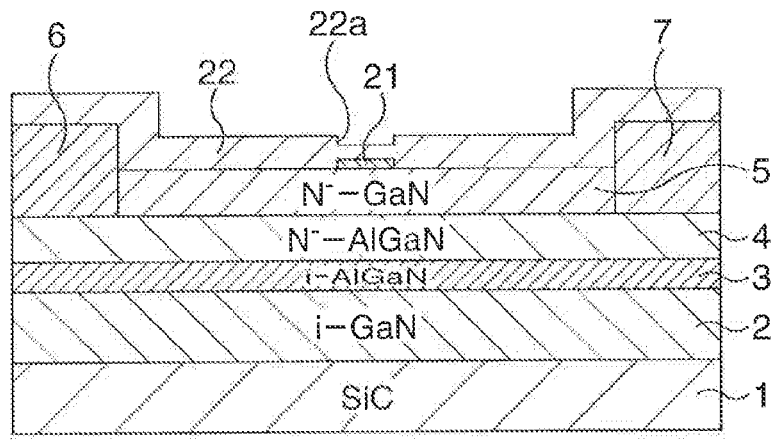

As shown in FIG. 4B, a dent 22 is formed in an area of the gate insulation film 22, corresponding to the base layer 21.

In detail, a resist is applied on the gate insulation film 22 and an opening portion (with a width of 1.2 μm, for example) is formed in an area of the resist, where the gate electrode is to be formed (the area corresponding to and above the base layer 21) by lithography. With this process, a resist mask (not shown) is formed.

Then, by using the resist mask, a portion of the gate insulation film 22, where is not covered by the resist mask is dry etched through the opening portion with an etching gas such as a fluorinated gas, until the thickness of the portion of the gate insulation film 22 becomes a desired film thickness as a gate insulation film (for example, about 10 nm). Accordingly, the dent 22a along the opening of the resist mask is formed in the area of the gate insulation film 22, where the gate electrode is to be formed.

The resist mask is removed in an ashing process or a peeling process.

Figure 4C:
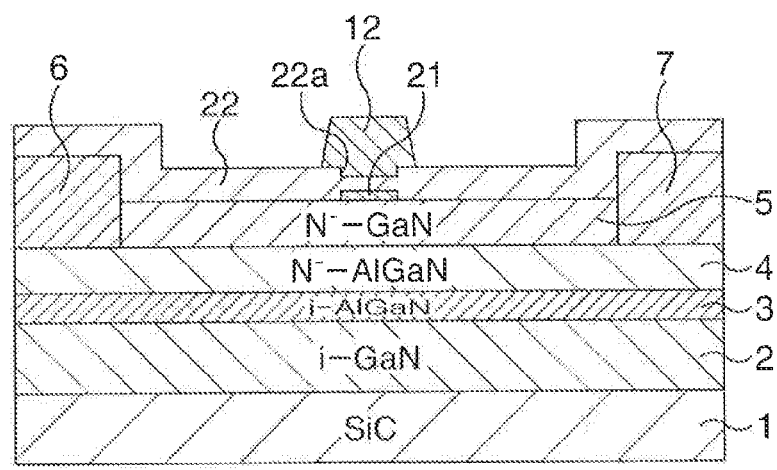

As shown in FIG. 4C, a gate electrode 12 is formed.

In detail, a resist is applied on the gate insulation film 22 and an opening portion (with a width of about 1.2 μm, for example) is formed in an area of the resist, where the gate electrode 12 is to be formed, that is, the area of the gate insulation film 22 corresponding to and above the dent 22a. With this process, a resist mask (not shown) is formed.

Then, metallic material, which is Ni (with a film thickness of about 30 nm)/Au (with a film thickness of about 300 nm) is deposited on the resist, with a film thickness to fill the opening portion of the resist mask, by a vapor deposition method, for example. Then, the resist mask and the Ni/Au thereon are removed by a lift-off method. Accordingly, the gate electrode 12 is formed above the gate insulation film 22 placed on the surface layer 5 via the base layer 21.

Thereafter, through processes for forming an interlayer insulation film, a contact hole, wirings and the like, the MIS-type GaN-FET according to the present embodiment is completed.

As described above, according to the present embodiment, the gate insulation film 22 is made of a high dielectric constant oxide to prevent shifting of a threshold value and reduction in mutual conductance. This also prevents an occurrence of an interface state between interfaces of the surface layer 5 and the gate insulation film 22, provides a desired insulating function of the gate insulation film 22, and compensates nitrogen separated during the manufacturing process, without any additional or complicated process. Accordingly, a reliable MIS-type GaN-FET is provided.

The occurrence of an interface state and the nitrogen separation from the surface layer 5 have an impact, particularly, on channels under the gate electrode 12. Thus, in each embodiment, the base layers 9, 21 are required to cover lower faces of the gate insulation films 11, 22 in an area under the gate electrode 12. Further, in view of preventing the impact as much as possible, the base layers 9, 21 can be formed to cover not only the area but also a wider area of the lower faces of the gate insulation film 11, 22 including the area with a limitation of not to contact (electrically contact) with the source electrode 6 and drain electrode 7.

Figure 5:
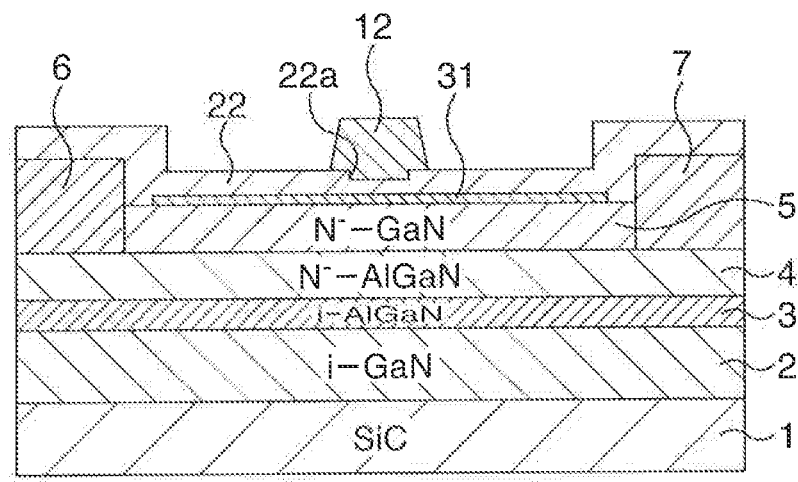
FIG. 5 is a schematic sectional view showing another example of a MIS-type GaN-FET according to the second embodiment.
Figure 6:
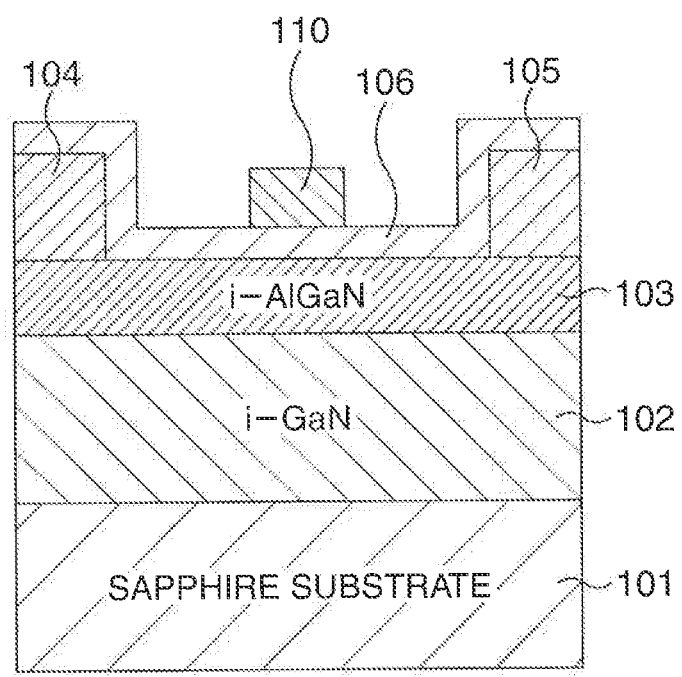
FIG. 6 is a schematic sectional view of a MIS-type GaN-FET according to a first conventional example.
Figure 7:
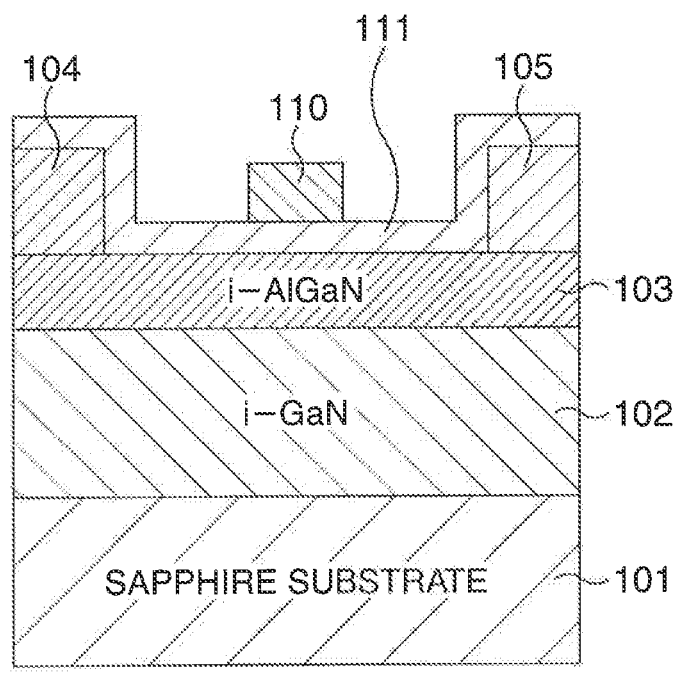
FIG. 7 is a schematic sectional view of a MIS-type GaN-FET according to a second conventional example.

FIG. 5 shows an example, in which the above case is applied to the second embodiment. FIG. 5 is a schematic sectional view corresponding to FIG. 4C and shows a completed MIS-type GaN-FET.

Here, a base layer 31 is formed wider than the base layer 21 to include not only a portion of lower face of the gate insulation film 22 under the gate electrode 12 but also wider area of the lower face of the gate insulation film 22 including the portion without being connected (electrically connected) to the source electrode 6 and drain electrode 7. When the base layer 31 is formed in a wider area in this way, the occurrence of an interface state is preferably prevented and nitrogen separated from the surface layer 5 is preferably compensated.

According to the present invention, the gate insulation film is made of a high dielectric constant oxide to prevent shifting of a threshold value and reduction in mutual conductance. This also prevents an occurrence of an interface state between interfaces of the nitride semiconductor layer and the gate insulation film, provides a desired insulating function of the gate insulation film, and compensates nitrogen separated during the manufacturing process without any additional steps or complicated steps. With this process, a reliable semiconductor device is provided.

What is claimed is:

1. A semiconductor device manufacturing method comprising:
    forming a base layer comprising a conductive nitride to an area including at least a portion where an gate electrode is formed, above a nitride semiconductor layer comprising a group III-V nitride semiconductor material;
    forming a gate insulation film comprising a high dielectric constant material to cover the base layer; and
    forming the gate electrode to a portion on the gate insulation film where is aligned with the base layer.

2. The semiconductor device manufacturing method according to claim 1,
    wherein the high dielectric constant material of the gate insulation film is one selected from tantalum oxide, hafnium oxide, zirconium oxide, lanthanum oxide and titanium oxide.

3. The semiconductor device manufacturing method according to claim 1,
    wherein the base layer comprises a metal nitride constituting the high dielectric constant material of the gate insulation film.

4. The semiconductor device manufacturing method according to claim 1,
    wherein the conductive nitride of the base layer is one selected from tantalum nitride, hafnium nitride, zirconium nitride, lanthanum nitride and titanium nitride.

5. The semiconductor device manufacturing method according to claim 1,
    wherein the high dielectric constant material of the gate insulation film is a material having a relative permittivity of 10 or more.

6. The semiconductor device manufacturing method according to claim 1, further comprising
    forming a concave portion to an area of the gate insulation film where the gate electrode is formed and corresponding to and above the base layer, as maintaining a predetermined thickness of the gate insulation film, after forming the gate insulation film and before forming the gate electrode,
    wherein, in said step of forming the gate electrode, the gate electrode is formed on the gate insulation film to fill the concave portion.

* * * * *